United States Patent [19]

Kawakami et al.

[11] Patent Number: 5,769,985
[45] Date of Patent: Jun. 23, 1998

[54] METHOD OF MANUFACTURING A MONOLITHIC CERAMIC ELECTRONIC DEVICE

[75] Inventors: Hiroyuki Kawakami, Toyama-ken; Yoshiaki Kohno, Moriyama; Noriyuki Kubodera, Shiga-ken, all of Japan

[73] Assignee: Murata Manufacturing Co., Ltd., Japan

[21] Appl. No.: 617,177

[22] Filed: Mar. 18, 1996

[30] Foreign Application Priority Data

Mar. 16, 1995 [JP] Japan .................................. 7-057303
Apr. 4, 1995 [JP] Japan .................................. 7-079120

[51] Int. Cl.[6] .................................................. B32B 31/26
[52] U.S. Cl. ........................... 156/89; 156/233; 156/239; 264/615; 264/619; 29/851
[58] Field of Search ............................ 156/89, 230, 233, 156/235, 247, 249, 239; 264/61, 614, 615, 618, 619; 29/851

[56] References Cited

U.S. PATENT DOCUMENTS

| | | | |
|---|---|---|---|
| 4,221,047 | 9/1980 | Narken et al. | 29/840 |
| 4,790,902 | 12/1988 | Wada et al. | 156/233 X |
| 4,879,156 | 11/1989 | Herron et al. | 428/137 |
| 4,929,295 | 5/1990 | Kohno et al. | 156/230 |
| 5,009,744 | 4/1991 | Mandai et al. | 156/89 X |
| 5,046,236 | 9/1991 | Wada et al. | 29/610.1 |
| 5,101,319 | 3/1992 | Diffeyes et al. | 361/321 |
| 5,304,274 | 4/1994 | Crownover et al. | 156/89 X |

FOREIGN PATENT DOCUMENTS

| | | |
|---|---|---|
| 474176 | 3/1992 | European Pat. Off. . |
| 485176 | 5/1992 | European Pat. Off. . |
| 60-21393 | 2/1985 | Japan . |
| 7-29771 | 1/1995 | Japan . |

*Primary Examiner*—Curtis Mayes
*Attorney, Agent, or Firm*—Ostrolenk, Faber, Gerb & Soffen, LLP

[57] ABSTRACT

A method of manufacturing a monolithic ceramic electronic device includes the following steps: forming a first metal film on a PET film; forming a multilayered metal film by forming a second metal film on a part of the first metal film, the second metal film being thicker than the first metal film; forming a monolithic ceramic structure including the multilayered metal film; forming the first metal film, which is partially overlain by the second metal film in the monolithic ceramic structure, into an insulating structure in such a manner that metal components forming the first metal film are diffused into the ceramics; and firing the ceramics. Disclosed also is a monolithic ceramic electronic device manufactured by the method. As a result, a stepped portion between a portion in which the internal electrodes overlap one another and a portion in which the internal electrodes do not overlap can be prevented from being formed, and delamination can effectively be prevented, whereby a monolithic ceramic electronic device exhibiting stable characteristics and a method for manufacturing the monolithic ceramic electronic device can be obtained.

11 Claims, 10 Drawing Sheets

METHOD OF MANUFACTURING A MONOLITHIC CERAMIC ELECTRONIC DEVICE

BACKGROUND OF THE INVENTION

1. Field of the Invention

The present invention relates to an electronic part and a method of manufacturing same, and more particularly to a monolithic ceramic electronic device and a method of manufacturing same.

The present invention can be adapted to a variety of electronic devices, e.g. a monolithic capacitor, a monolithic piezoelectric device or a multilayered ceramic substrate, and a method of manufacturing such devices.

2. Related Background Art

Methods are known of integrally firing metal elements and ceramic elements for manufacturing a monolithic ceramic electronic device, such as a monolithic capacitor, having internal electrodes.

For example, a pattern made of conductive paste is printed on a ceramic green sheet to form internal electrodes. Then, a plurality of the ceramic green sheets each having the internal electrodes are laminated, and then an appropriate number of ceramic green sheets having no internal electrodes are laminated on both sides of the stack of green sheets to form a monolithic ceramic structure. Alternatively, predetermined patterns of ceramic paste and conductive paste may be sequentially printed to form a monolithic ceramic structure.

Then, the monolithic ceramic structure is pressed in a direction of its thickness so that the ceramic layers are brought into tight contact with each other. Further, the monolithic ceramic structure is fired to obtain a sintered structure. Appropriate external electrodes are formed on the outer surface of the sintered structure to produce a monolithic ceramic electronic part.

In recent years it has been required to reduce the sizes of electronic parts, as well as the sizes and thicknesses of monolithic ceramic electronic devices. When the monolithic ceramic electronic device is intended to be reduced in size and thickness, the ceramic layers, each of which is held between the internal electrodes, are required to be made thinner. Accordingly, thinner green sheets are required when the monolithic ceramic structure is manufactured.

However, it is difficult to handle excessively thin ceramic green sheets. Moreover, the portions including the internal electrodes, which overlap one another, are thicker than the portions not including internal electrode in a monolithic ceramic structure. As a result, steps have been inevitably formed between these portions.

In particular, since the steps are formed when the monolithic ceramic structure is pressed in the direction of its thickness prior to the firing process, the pressure is mainly applied onto the portions where the internal electrodes overlap one another. Accordingly, the pressure is insufficient in the other portions. As a result, there is a possibility that a layer-separating phenomenon called delamination may occur. Also, there is a possibility that solvent in the ceramic green sheet may cause the internal electrodes to be swelled. If that occurs, the internal electrodes cannot accurately be formed into desired shapes.

Therefore, it has been extremely difficult to reduce the thickness of a ceramic green sheet to about 6 $\mu$m or thinner.

Such problems may arise in making a monolithic ceramic structure in which ceramic paste and conductive paste are alternately laminated.

To overcome these problems, a method has been suggested in which a metal film, formed by a thin film forming method, is used as the internal electrodes, the method being exemplified by the following first to third methods.

Figure 1:
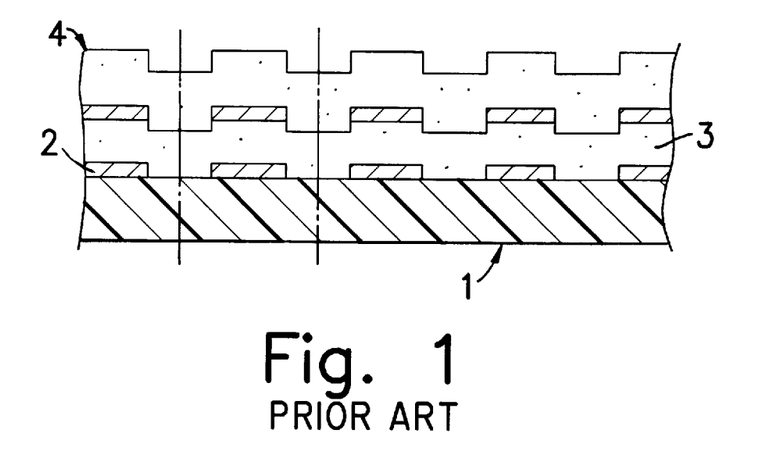
FIG. 1 is a cross sectional view showing a conventional method of manufacturing a monolithic capacitor.

The first method, shown in FIG. 1, begins with the step of forming a metal film over the entire surface of a supporting member 1 by using a thin film forming method, such as a sputtering method. Then, a resist layer having openings corresponding to the shapes of the electrodes is formed on the metal film, and then the metal film is patterned by photolithography. Thus, a metal film 2 is formed as shown in FIG. 1. Then, a ceramic green sheet 3 is formed on the metal film 2. By repeating the steps of forming the metal film 2 and forming the ceramic green sheet 3, a monolithic structure 4 is formed.

In the second method, which is disclosed in JP-A-64-42809, a ceramic green sheet is formed on a first film made of synthetic resin; and a metal film is formed on a second supporting film by a thin film forming method. Then, the metal film supported by the second supporting film is transferred to the ceramic green sheet on the first supporting film so that the green sheet has the metal film thereon. A monolithic ceramic structure is obtained by laminating a plurality of such green sheets.

The third method begins with the step of forming a metal film on the entire surface of a supporting film by a thin film forming method. Then, the metal film is patterned by a photolithography method. Next, a ceramic green sheet is formed on the supporting film having the patterned metal film thereon so that the green sheet is combined with the metal film. Then, the green sheet supported by the supporting film is transferred onto a substrate by using a thermal transfer method so that a monolithic ceramic structure is obtained.

The first to third methods, in each of which metal films formed by a thin film forming method are used as the internal electrodes, are able to make the internal electrodes thinner as compared with the method of forming the internal electrodes by using conductive paste.

Figure 2:
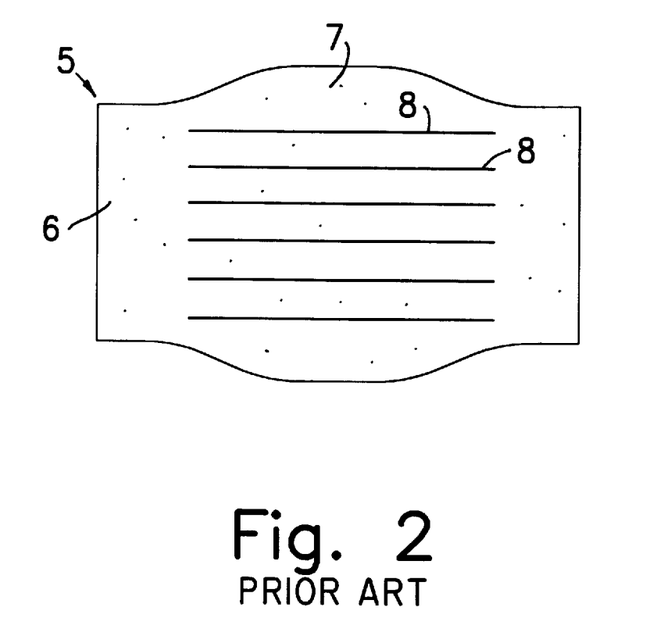
FIG. 2 is a cross sectional view showing a monolithic ceramic structure in a conventional monolithic capacitor.

However, past attempts to make each layer thinner have resulted in an increase in the number of laminated layers, thus causing the internal electrodes to be thickened in comparison with the thickness of the ceramic layer held between the internal electrodes. As a result, as shown in FIG. 2, the first method results in a difference in thickness between a portion 6, in which only the ceramic green sheets are laminated, and a portion 7, in which internal electrodes 8 overlap one another. Therefore, when the laminated structure is pressed in the direction of its thickness, the pressure is primarily applied only to the portion in which the internal electrodes 8 overlap one another. Thus, the strength of adhesion between the ceramic layers may be reduced in the region 6 in which the internal electrodes do not overlap. As a result, delamination may easily take place when the laminated structure is sintered.

Moreover, the first method requires further process steps after the metal film has been formed on the supporting member, such as a step of forming patterns of a resist layer, a step of etching the pattern and a step of stripping the resist layer off.

The second method also encounters the problem of thickening of the portion in which the internal electrodes overlap one another, as compared with the region having no internal electrodes. Therefore, the second method also may suffer from the delamination problem. Further, in the case where the ceramic green sheets are made extremely thin, it would be difficult to handle such green sheets. Moreover, it would be difficult to position the metal film on a green sheet with high accuracy because a transferring process is involved.

And, in the transferring process, the ceramic green sheet must be brought into contact with the second supporting film in order to make the portion having no metal film. The second supporting film must be stripped from the green sheet having the metal film after the transferring process. Therefore, both the metal film and the ceramic green sheet must be able to be easily stripped from the second supporting film. However, this requirement can not easily be satisfied. Thus, there is a possibility that a portion of a ceramic green sheet may be destroyed when stripping off the second supporting film.

Since the third method has the steps of forming the metal film by the thin film forming method and then performing the patterning process by the photolithography method, this manufacturing process tends to become complicated. Moreover, making the structure in which the metal film and the ceramic green sheet are in contact with the supporting film requires both the metal film and the ceramic green sheet to be easily stripped from the supporting film when transference from the supporting film is performed. However, this requirement cannot easily be satisfied.

SUMMARY OF THE INVENTION

Accordingly, an object of the present invention is to provide a method of manufacturing a monolithic ceramic electronic device which is capable of preventing occurrence of a difference in thickness between a region in a monolithic ceramic structure in which internal electrodes are formed, and a region in which the internal electrodes are not formed, and is therefore capable of effectively preventing delamination.

A further object is to provide a method which is capable of manufacturing a monolithic ceramic electronic device more simply and stably than the conventional methods of manufacturing the monolithic ceramic electronic device which have included a step of forming the internal electrodes by a thin film forming method.

To achieve these objects, according to one aspect of the present invention, there is provided a method of manufacturing a monolithic ceramic electronic device, including the steps of: forming a first metal film on a first supporting member by a thin film forming method; forming, on the first metal film, a resist layer having pattern holes therein; forming second metal films thicker than the first metal film within the pattern holes formed in the resist layer; forming a monolithic ceramic structure including the resist layer and the first and second metal films; and firing the monolithic ceramic structure to change the first metal film into an insulating material and to remove the resist layer.

According to another aspect of the present invention, the step of forming the monolithic ceramic structure includes the steps of forming a ceramic green sheet on a second supporting member; and separating the monolithic ceramic structure from the first supporting member while separating the ceramic green sheet from the second supporting member, and alternately stacking, on a laminating stage, the monolithic ceramic structure and the ceramic green sheet.

According to a further aspect of the present invention, the step of forming the monolithic ceramic structure includes the steps of forming a ceramic green sheet on a second supporting member; transferring, onto the ceramic green sheet, the monolithic ceramic structure on the first supporting member to form a green sheet including a metal film; and sequentially transferring and stacking a plurality of the green sheets each having the metal film and thereby forming the monolithic ceramic structure.

It is preferable that transference of the metal film be performed by using a roll press in the step of forming the green sheet having the metal film by the transferring method, so as to enable a thin metal film to be easily and smoothly transferred to the ceramic green sheet.

According to these aspects of the present invention, the first metal film is thinner than the second metal film. The thickness is predetermined such that the first metal film can be formed into an insulating material or structure during firing. The process for converting the first metal film into the insulating material can be realized by diffusion of the metal composing the metal film into the surrounding ceramics, the metal being diffused in the form of oxide ions. The predetermined thickness with which the first metal film is formed into the insulating structure cannot be determined definitely, because the thickness varies depending upon the material composing the first metal film and the firing conditions including the firing temperature. However, it is preferable that the thickness be 0.1 μm or thinner. As a result, the first metal film can reliably be formed into the insulating structure.

The resist layer is mainly composed of resist resin which disappears when fired. Since the resist layer disappears when the firing process is performed, a process of stripping off the resist layer is not required in the present invention. Moreover, in the firing process, surrounding ceramics are moved into the portion from which the resist layer has disappeared. Therefore, a problem of generation of voids can be prevented.

Preferably, inorganic components are added to the resist. The inorganic components are composed of inorganic materials, such as ceramics or glass, which do not disappear after firing. Thus, the inorganic components have a function of preventing reduction of the strength of the portion from which the resist layer has disappeared. In the case where the inorganic components are contained in the resist layer, the surrounding ceramics move smoothly into the portion from which the resist resin has disappeared due to firing. As a result, the composition of the ceramics in the sintered body is homogeneous over the entire sintered body. Therefore, the structure, in which the inorganic components are contained in the resist layer, enables a further uniform and dense sintered structure to be obtained.

The materials of the first and second metal films are not limited particularly. According to an aspect of the present invention, the first metal film contains Cu and the second metal film contains Ni. The first metal film containing Cu can easily be changed into oxides to form the insulating structure after firing. By forming the second metal film with Ni, the cost of the internal electrodes can be reduced.

According to a further aspect of the present invention, there is provided a method of manufacturing a monolithic ceramic electronic part comprising the steps of: forming a first metal film on a first supporting member by a thin film forming method; forming a multilayered metal film by forming a second metal film on a part of the first metal film by the thin film forming method, the second metal film being thicker than the first metal film; forming a monolithic ceramic structure incorporating the multilayered metal film; and forming a portion of the first metal film, which is not underlain by the second metal film in the monolithic ceramic structure, into an insulating structure by causing the metal components forming the portion to diffuse into the ceramics, in conjunction with firing the ceramics.

According to a still further aspect of the present invention, the thickness of the first metal film is about 100 nm or thinner and the thickness of the second metal film is at least about 300 nm and at most about 1000 nm. The reason for this is that the first metal film must be structured in such a manner that the portion of the first metal film, which is not located below the second metal film, is required to be changed into the insulating structure when the ceramics are fired. That is, the thickness of the first metal film is 100 nm or less so that the metal components composing the first metal film can easily be diffused into the ceramics due to firing in such a manner that the metal components are in the form of oxide ions when diffused. The reason why the thickness of the second metal film is at least 300 nm is that oxidation of the second metal film is prevented when the first metal film portion is changed into the insulating structure. That is, the second metal film serves as the internal electrodes. Note that the upper limit on the thickness of the second metal film is not limited particularly. However, to use the second metal film as the internal electrodes of a monolithic ceramic electronic device and to achieve the main object of the present invention, which is to prevent generation of a stepped portion, the thickness is usually determined to be at most 1000 nm.

According to one aspect of the present invention, the step of converting the part of the first metal film into the insulating structure and firing the ceramics is performed by firing the monolithic ceramic structure under a partial pressure of oxygen at which the first metal film is oxidized but the second metal film is not oxidized. That is, control of the partial pressure of oxygen to that level enables the first metal film to be oxidized at the time of firing the ceramics, and the first metal film portion, which is not located below the second metal film, to be converted into the insulating structure, and prevents oxidation of the second metal film. The level of the partial pressure of oxygen can be determined appropriately and easily adapted to different materials and to the thicknesses of the first and second metal films and temperature and time for which the firing process is performed.

The step of forming the multilayered metal film can be performed by an appropriate photolithography method. For example, the step of forming the multilayered metal film has the steps of forming, on the first metal film, a resist layer having pattern holes therein; forming, in the pattern holes in the resist layer, second metal films each of which is thicker than the first metal film by the thin film forming method; and stripping the resist layer.

Also, the step of forming the monolithic ceramic structure including the multilayered metal film can be realized by a conventional transference method. According to an aspect of the present invention, the step of forming the monolithic ceramic structure has the steps of forming a green sheet including a metal film by forming a ceramic green sheet on the multilayered metal film; and stacking a plurality of such green sheets. According to another aspect of the present invention, the step of forming the monolithic ceramic structure is realized by a transferring method having the steps of forming a ceramic green sheet on a second supporting member; forming a green sheet including a metal film by transferring, to the ceramic green sheet, the multilayered metal film supported by the first supporting member; and forming the monolithic ceramic structure by sequentially transferring a plurality of the green sheets each having a metal film. When the transferring method is employed, it is preferable that a roll press be used to transfer the multilayered metal film to the ceramic green sheet.

In the present invention, the first metal film is formed, and then the resist layer is formed. Then, the second metal films are formed within the pattern holes in the resist layer so that a laminated member including a metal-layer and a resist-layer is formed. Therefore, no operations, such as etching and stripping of the resist layer, are required to be performed. That is, the step of etching the first metal film and the step of stripping the resist can be omitted. Therefore, the time required to process the metal film formed by the thin film forming method can significantly be shortened. Moreover, the incidence of defective parts can be lowered, such incidents often being due to the process of washing off the etching liquid. Since the resist is not required to have etching resistance, resin for forming the resist may be selected from a wide variety of materials. Thus, the cost of the material can be reduced.

Moreover, in the step of firing the monolithic ceramic structure including a laminated member having a metal layer and a resist layer, the resist layer is stripped and the first metal film is converted into the insulating structure at the same time the ceramics are fired. Therefore, no additional process is required to easily and stably obtain a sintered structure for a monolithic ceramic electronic device in which internal electrodes formed by the second metal film are stacked.

The first metal film formed on the overall surface enables the size of the stepped portion, between the portion in which the internal electrodes overlap one another, and the portion in which the internal electrodes do not overlap, to be reduced. As a result, generation of delamination can be prevented satisfactorily.

In the case where the step of forming the monolithic ceramic structure consists of the step of forming the ceramic green sheet on the second supporting member; and the step of alternately stacking, on the stacking stage, a laminated member having the metal-layer and resist-layer supported on the first supporting member and the ceramic green sheet supported by the second supporting member, a sole member is stripped from each supporting member. That is, the first metal film is stripped from the first supporting member and the green sheet is stripped from the second supporting member. Therefore, the force required to strip each member can easily be controlled.

In the case where the step of forming the monolithic ceramic structure is performed by the transferring method, that is, in the case where the ceramic green sheet is previously formed on the second supporting member, and then a laminated member having metal layers and resist layers is transferred to the ceramic green sheet to form the green sheet integrally having the metal film, only the ceramic green sheet is stripped from the supporting member when the stacking process is performed. Therefore, the force required to strip the ceramic green sheet off of the supporting member can easily and reliably be controlled by using an appropriate release layer. As a result, by using the transference method, a ceramic green sheet and electrode material that is even thinner than previously may be employed to manufacture a monolithic ceramic electronic device. Moreover, delamination which occurs due to defective stacking and/or defective pressing can be prevented.

As a result, according to the present invention, if the thickness of a monolithic ceramic electronic device to be manufactured is intended to be reduced and the number of stacked internal electrode layers of the same is intended to be increased, the incidence of defective parts due to delamination can be lowered. Moreover, monolithic ceramic electronic devices can stably be supplied with a simple process.

The method of manufacturing the monolithic ceramic electronic device according to the present invention, including the step of forming the first metal film on the entire surface of the first support layer, enables the size of the stepped portion, between the region in which the internal electrodes overlap one another (the region in which the second metal films overlap one another), and the region in which the internal electrodes do not overlap, to be reduced. As a result, delamination in the obtained sintered structure can effectively be prevented.

Moreover, the first metal film is converted into the insulating structure in the process of firing the ceramics. Therefore, the first metal film which is formed to reduce the size of the stepped portion does not act as a conductor. As a result, even if the first metal film is formed, short circuits and the like do not occur. Moreover, the necessity of partially stripping the first metal film in the following step by etching or the like can be eliminated. Therefore, an additional process for forming a multilayered metal film is not required.

The first metal film is in the form of oxide ions, diffused into the ceramics. By controlling the composition of the first metal film, the composition of the ceramics can be controlled. Therefore, a monolithic ceramic electronic device exhibiting desired characteristics can be provided.

The multilayered metal film is supported by the supporting member. In this state, only the first metal film is in contact with the supporting member. Therefore, the stripping force required to strip the multilayered metal film off the supporting member is easily determinable with an appropriate release layer. Therefore, the stripping force required to remove the first metal film from the supporting member can easily be determined. As a result, in an exemplary case where the multilayered metal film is transferred to the ceramic green sheet formed on the second supporting member, the multilayered metal film can easily be stripped from the supporting member. Since the second supporting member is in contact with only the ceramic green sheet, the second supporting member is required to be stripped easily and smoothly from the ceramic green sheet. Therefore, the second supporting member is required to have a simple stripping characteristic.

The present invention may be adapted to any of a variety of methods of manufacturing a monolithic ceramic electronic device of a type including internal electrodes, such as a monolithic capacitor, a ceramic-laminated piezoelectric part and a multilayered ceramic substrate.

Other objects, features and advantages of the invention will be evident from the following detailed description of the preferred embodiments described in conjunction with the attached drawings.

DETAILED DESCRIPTION OF EMBODIMENTS OF THE INVENTION

Referring to the figures, preferred embodiments of the present invention will now be described.

First Embodiment

Figure 3A:
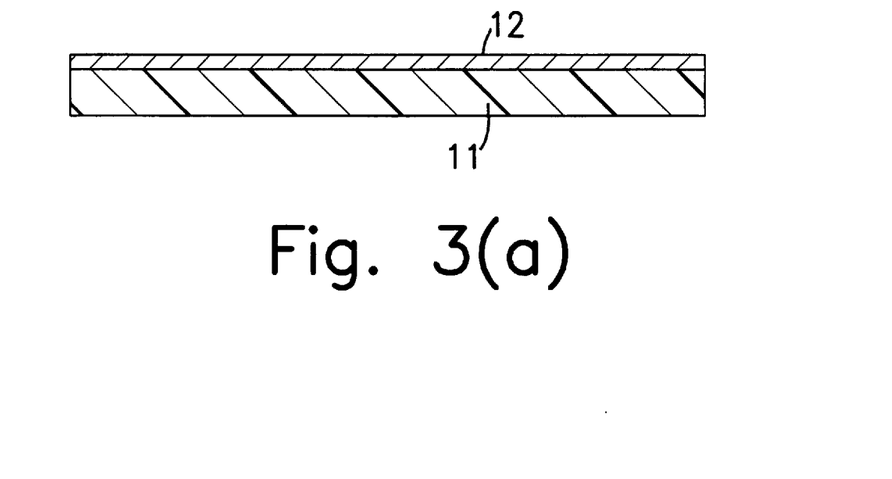
FIGS. 3A and 3B are cross sectional views respectively showing a step of forming a first metal film on a first supporting member according to a first embodiment of the invention and a step of forming a resist layer and a second metal film.

As shown in FIG. 3(a), a polyethylene terephthalate film serving as a first supporting member 11 is coated with silicon resin (not shown). Then, a first metal film 12 is formed over the entire surface of the first supporting member 11. The first metal film 12 is an Ag layer having a thickness of 0.1 $\mu$m and is formed by an evaporation method.

Then, a resist layer is formed on the first metal layer 12 by applying a resist having a thickness of 0.8 $\mu$m. The resist, whose main components are quinone and diazide formalin resin, contains 10 vol % of $BaTiO_3$ powder.

Figure 3B:
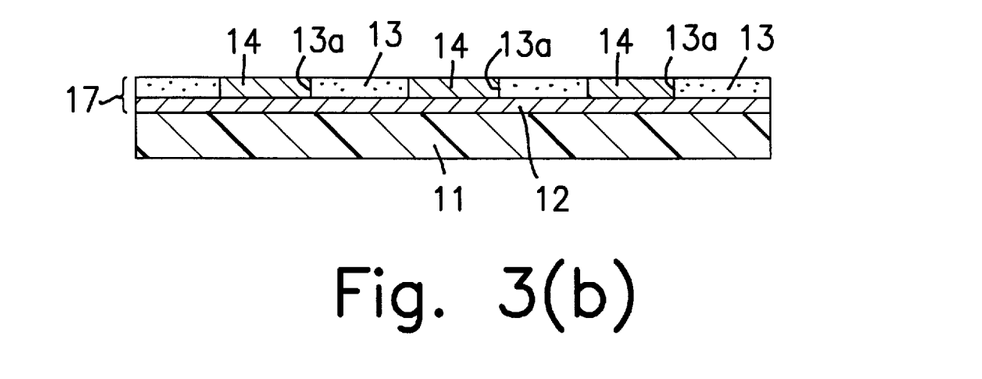

Then, an exposing process and a developing process are performed, to obtain a resist layer 13 having pattern holes 13a formed therein as shown in FIG. 3(b).

Next, second metal films 14 are formed on the first metal film 12 in the regions within the pattern holes 13a formed in the resist layer 13. The second metal films 14 are formed by applying Pd to have a thickness of 0.8 μm by electroplating. The second metal films 14 form internal electrodes to be described later.

Figure 4:
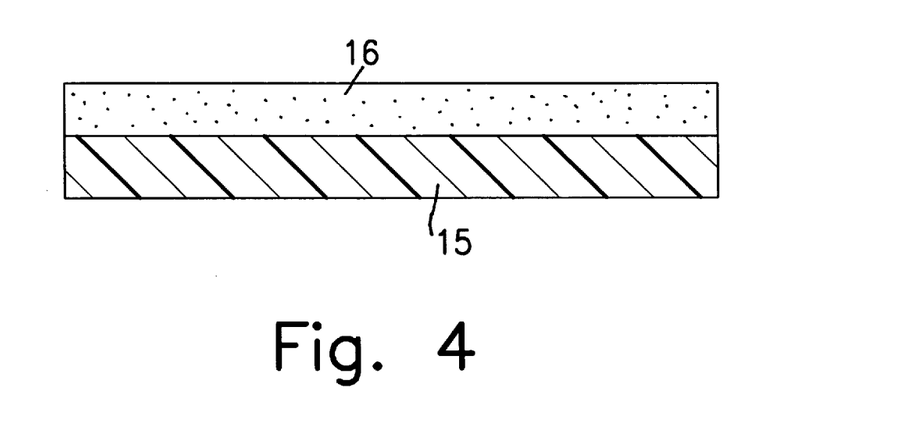
FIG. 4 is a cross sectional view showing a step of forming a ceramic green sheet on a second supporting member.

On the other hand, a polyethylene terephthalate film is prepared as a second supporting member 15 as shown in FIG. 4. Then, ceramic slurry whose main component is $BaTiO_3$ is formed into a sheet on the polyethylene terephthalate film 15 to have a thickness of 6 μm so that a ceramic green sheet 16 is obtained.

Then, a plurality of laminated members 17 having metal layers 14 and resist layers 13 as shown in FIG. 3(b) are alternately laminated with the ceramic green sheets 16 so that a monolithic structure is obtained. The monolithic structure is obtained by stacking a laminated member 17, while supported by the polyethylene terephthalate film serving as the first supporting member 11, on the ceramic green sheet 16. This is done by placing the upper side of the monolithic structure 17, i.e. the side on which the second metal layers 14 are coated, in contact with the ceramic green sheet 16; and then pressing the monolithic structure, at about 80° C.; and then stripping off the first supporting member 11. Then, similar heat pressing steps are performed so that the ceramic green sheets 16 and laminated members 17 are sequentially laminated. Thus, a laminated member 18 shown in FIG. 5 can be obtained.

Figure 5:
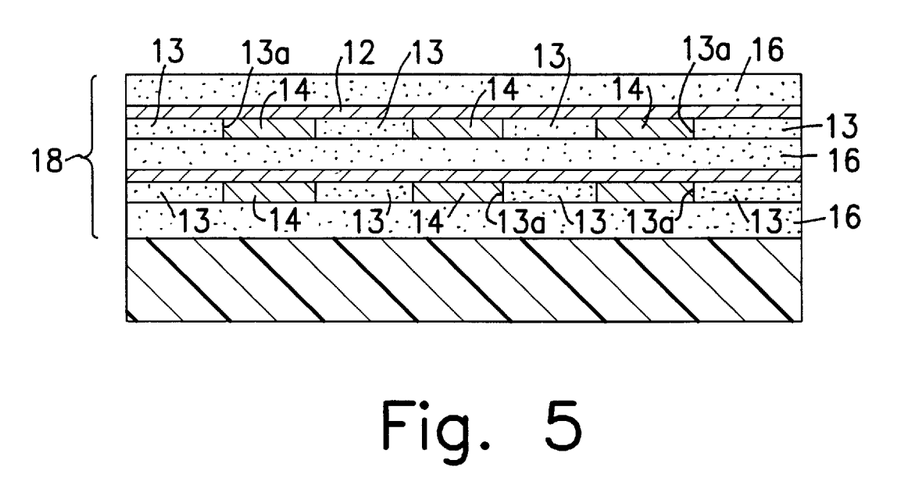
FIG. 5 is a cross sectional view showing a monolithic structure before it is fired.

The laminated member 18 is cut in the direction of its thickness to obtain predetermined monolithic chips for monolithic capacitors. Then, the obtained monolithic chips are fired at 1300° C. in air. As a result, a sintered member 19 shown in FIG. 6 can be obtained. In the sintered member 19, internal electrodes 20, each of which is formed by a second metal film 14, overlap one another.

Figure 6:
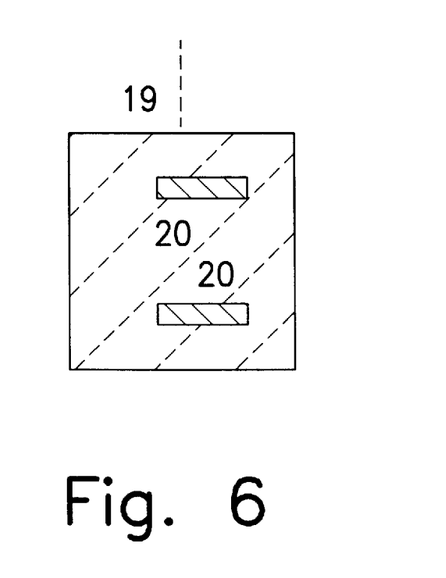
FIG. 6 is a horizontal cross sectional view showing a sintered structure obtained by firing a monolithic chip.

Note that the first metal film 12 is heated in the firing process so as to change it into an insulating material. In the resist layer, resist resin has disappeared during the firing process. On the other hand, ceramic powder contained in the resist layer and ceramic that has moved from the peripheral region of the resist layer form a dense sintered structure similarly to the sintered portions where no resist was initially present. As a result, the internal electrodes 20 are surrounded by dense ceramics, as shown in FIG. 6.

Figure 7:
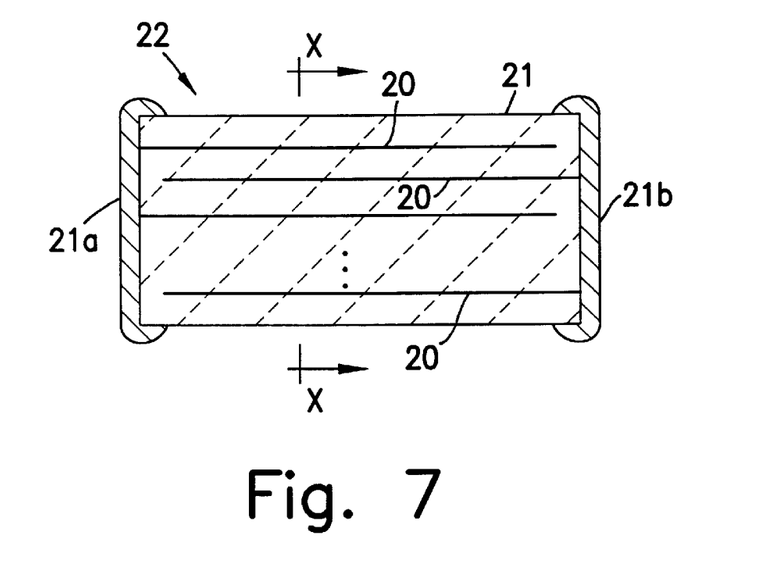
FIG. 7 is a schematic cross sectional view showing a monolithic capacitor obtained according to the first embodiment.

On the outer surface of the sintered structure obtained as described above, external electrodes 21a and 21b as shown in FIG. 7 are applied. Thus, a monolithic capacitor 22 is obtained. Note that FIG. 6 shows a cross section taken along line X—X of the sintered structure shown in FIG. 7.

The structure of the monolithic capacitor 22 that was obtained was observed by cutting in the direction X—X shown in FIG. 7. It was seen that stepped portions, between the portions in which the internal electrodes overlap one another, and the portions in which the internal electrodes do not overlap, were decreased as compared with the conventional monolithic capacitor.

The electrical characteristics of the monolithic capacitor were measured. It was seen that the desired design characteristics were obtained. In this measurement, no delamination was seen in the sintered structure.

The characteristics of a monolithic capacitor manufactured by a conventional method were also measured. As a result of this measurement, delamination was observed in the vicinity of the outlet portions for the external electrodes, that is, in the vicinity of the end surfaces of the sintered structure on which the external electrodes were formed. The percentage of the monolithic capacitors that had delamination was about 25%.

The region of the monolithic capacitor according to this embodiment, in which the resist layer was formed, was observed by cutting the sintered structure. It was seen that the resist components disappeared and the $BaTiO_3$ components remained. Moreover, the portion in which the resist layer had been formed was in a sintered state similar to the state of the other ceramic portions. Therefore, it can be considered that surrounding ceramics moved so as to replace the resist layer and, therefore, a dense sintered structure was formed.

Moreover, the first metal film 12 disappeared after the firing process. Therefore, although the first metal film is formed as described above, no short circuits are caused to occur in the monolithic capacitor thus obtained.

Second Embodiment

A multilayered ceramic substrate was manufactured by a method similar to that according to the first embodiment except that a Cu film was used in place of the Ag film to serve as the first metal film, an Ni film was used in place of the Pd film to serve as the second metal film, resist resin containing 10 vol % of $Al_2O_3$ powder and 5 vol % of glass powder was used, and firing was performed at 1200° C. in a reducing atmosphere.

In the obtained multilayered ceramic substrate, there was no formation of a stepped portion between the portion in which the internal electrodes overlapped one another, and the portion in which the internal electrodes did not overlap.

The characteristics of the obtained multilayered ceramic substrate were measured. The desired design characteristics were attained. The obtained multilayered ceramic substrate was cut in the direction of its thickness. No defect due to delamination was observed.

The region in which the resist was formed was in substantially the same sintered state as that of the other ceramic portions. That is, it can be considered that the resist components were evaporated, the contained glass components were dissolved, the alumina components were retained and the surrounding ceramics were moved when the substrate was heated for sintering.

The copper components forming the first metal film substantially disappeared and, thus, no defects in terms of insulation or defects such as generation of voids were seen to exist.

Third Embodiment

A monolithic capacitor was manufactured by a method similar to that of the first embodiment except that a resist was used to which no inorganic powder, such as ceramic powder or glass powder, was added.

With this resist, the formation of a stepped portion between the portion in which the internal electrodes overlapped one another, and the portion in which the internal electrodes did not overlap, could not be reduced satisfactorily. However, it was found that by applying pressure uniformly in the pressing process after the laminating step, it was possible to satisfactorily prevent delamination, as compared with a monolithic capacitor obtained by the conventional method.

Although in the first to third embodiments the first metal film and the second metal film were formed of different metals, the same metal may be used to form the first metal film and the second metal film.

Fourth Embodiment

Figure 8:
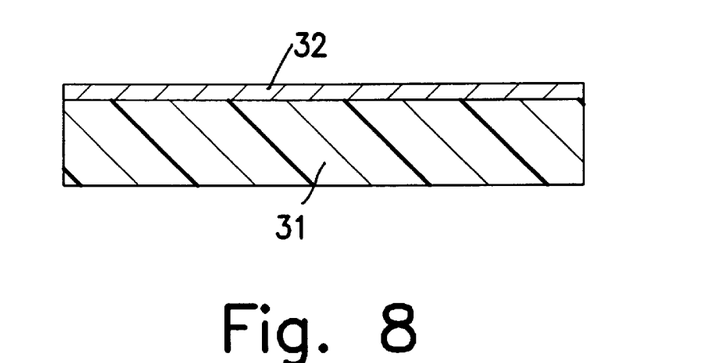
FIG. 8 is a cross sectional view showing a step of forming a first metal film on a first supporting member according to a fourth embodiment of the invention.

As shown in FIG. 8, a first supporting member 31 having the PET film coated with a silicon release agent (not shown) was prepared. On the silicon release agent layer, there was formed the first metal film 32. The first metal film 32 was obtained by forming a Cu film having a thickness of 0.1 μm on the entire surface of the first supporting member 31 by an evaporating method.

Figure 9:
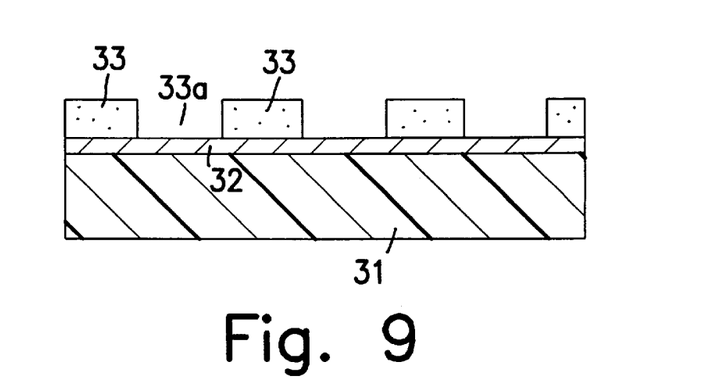
FIG. 9 is a cross sectional view showing a step of forming a resist layer having pattern holes on the first metal film.

Then, a resist layer 33 having a thickness of 0.8 μm was applied to the surface of the first metal film 32, the resist layer containing 50 vol % of $BaTiO_3$ powder. Then, an exposing process and a developing process were performed so that pattern holes 33a were formed in the resist layer. As a result, a resist layer 33 having pattern holes 33a therein as shown in FIG. 9 was formed.

Figure 10:
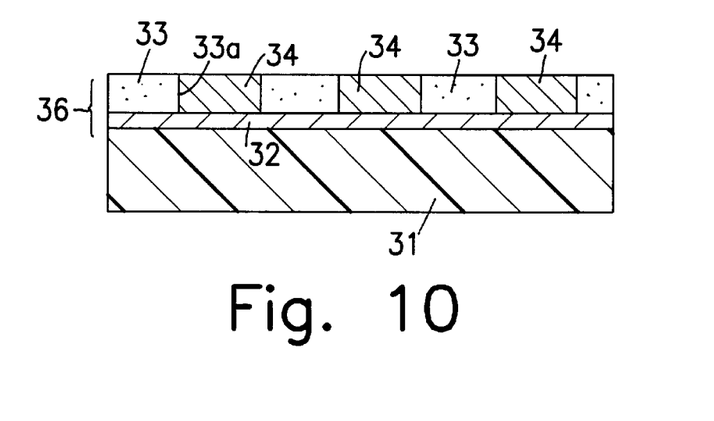
FIG. 10 is a cross sectional view showing a step of forming a second metal films within the pattern holes in the resist layer.

Then, a second metal film 34 (see FIG. 10) was formed in each pattern hole 33a. The second metal films 34 were obtained by forming Ni films each having a thickness of 0.8 μm by electroplating.

On the other hand, a second supporting member 39 comprising a PET film having a thickness of 50 μm was prepared. Ceramic slurry, the main component of which was $BaTiO_3$ powder, was formed on the second supporting member 39 in the form of a sheet, forming a ceramic green sheet 37.

Figure 11:
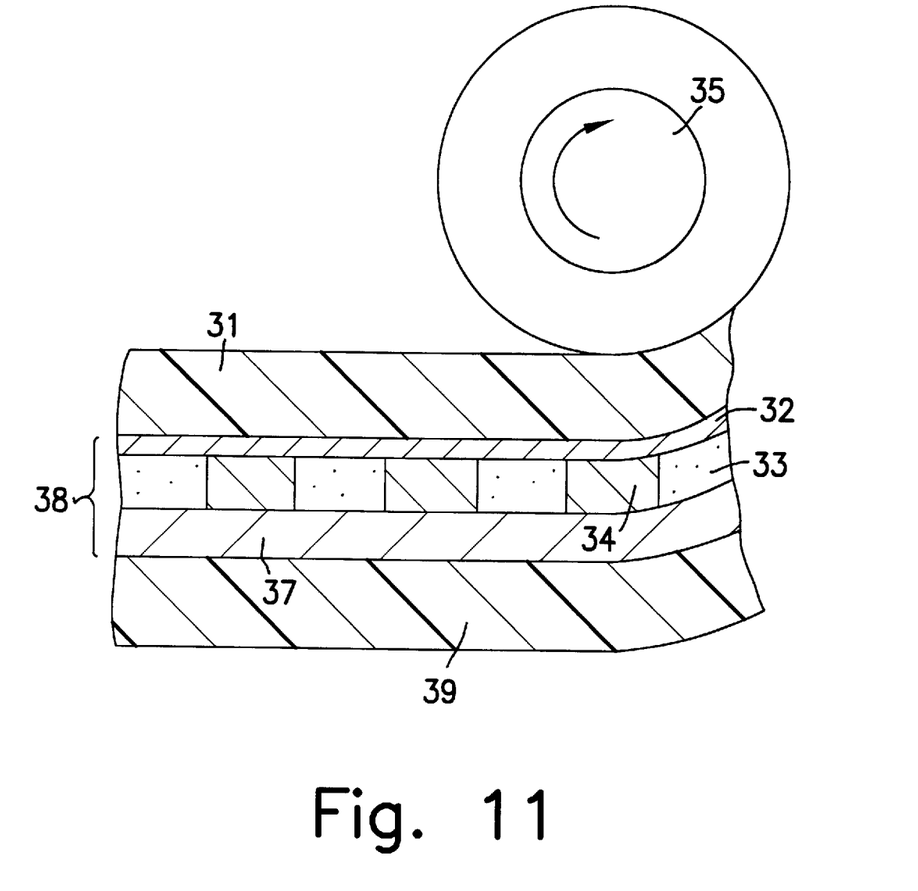
FIG. 11 is a partially-cut cross sectional view showing a process for forming a metal sheet integrally having a green sheet by using a roll press.

Then, a roll-type press 35 was used on the ceramic green sheet as shown in FIG. 11 so as to transfer the metal-layer and resist-layer laminated member 36 (see FIG. 10) onto the ceramic green sheet 37 supported on the second supporting member 39. Then, the PET film 39 was stripped off. As a result, a green sheet 38 which contains the above-mentioned metal films was formed.

Figure 12:
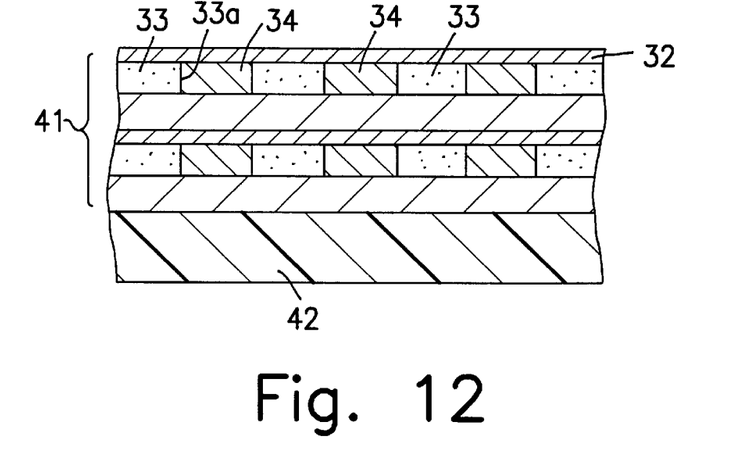
FIG. 12 is a cross sectional view showing a laminated structure.

Then, as shown in FIG. 12, a PET film was prepared as a third supporting member 42, and the green sheets 38 were stacked on the third supporting member 42 while their relative positions were accurately controlled. Whenever one green sheet 38 was stacked, heat pressing was performed. After each heat pressing process had been performed, the corresponding first supporting member 31 was stripped off so that a monolithic structure was obtained, the obtained monolithic structure being shown in FIG. 12.

Then, the laminated member 41 obtained as described above was cut in the direction of its thickness so that chips, each of which was formed into a monolithic structure, were obtained to serve as individual monolithic capacitors. Then, the monolithic chips were fired so that sintered structures were obtained, and then external electrodes were formed similarly to the first embodiment. As a result, monolithic capacitors were produced.

Fifth Embodiment

A monolithic capacitor was manufactured similarly to the fourth embodiment except that resist containing no inorganic powder was used.

Evaluations of the Fourth and Fifth Embodiments

After performing the manufacturing process according to the fourth embodiment, the monolithic structure chip was cut to observe the internal portion thereof prior to performing the firing process. It was observed that generation of a stepped portion between the portion in which the second metal films forming the internal electrodes overlapped one another and other portions could substantially be prevented.

Sintered structures in the obtained monolithic capacitor were cut in a direction parallel to the end surface on which the external electrodes was formed so that the internal structure was observed. It was observed that generation of a stepped portion between the portion in which the internal electrodes overlapped one another and the portion in which the internal electrodes did not overlap was substantially prevented. That is, the structure in which ceramic powder was contained in the resist layer prevented generation of the stepped portion at the time of performing the firing process.

In the portion in which the resist layer was formed, resin contained in the resist disappeared and the contained ceramic powder was retained. Moreover, the structure of the portion of the sintered body in which resin initially existed was substantially the same as that of the other ceramic portions. Therefore, it can be considered that the ceramic powder retained and the surrounding ceramics moved at the time of performing the firing process so that a structure of the portion that originally contained resin became the same as that of the surrounding portion.

Moreover, probably due to the thickness of the first metal film, to which the resist was applied, of 0.1 μm or thinner, the first metal film was changed into an insulating structure due to the firing process. Therefore, it can be understood that monolithic capacitors can stably be supplied, which do not easily encounter defects, such as short circuits, defective insulation, generation of voids and delamination.

Also, after carrying out the process of the fifth embodiment, the monolithic chip was cut in the direction of its thickness prior to obtaining the sintered structure to observe the stepped portion, between the portion in which the second metal films forming the internal electrodes overlapped one another, and the other portions. Although the stepped portion was not significantly reduced as compared with the monolithic chip obtained in the fourth embodiment, the stepped portion was reduced satisfactorily as compared with the monolithic chip obtained by the conventional method.

The internal structure of the obtained sintered structure was analyzed similarly to the evaluation method employed in the fourth embodiment. It was seen that the first metal film portion was converted into an insulating structure due to the firing process. Moreover, the obtained monolithic capacitor was free from defects, such as short circuits, defective insulation, generation of voids and delamination.

In the manufacturing methods according to the fourth and fifth embodiments, only the ceramic green sheet was in contact with the supporting film. Therefore, the release agent layer on the film is only required to enable the ceramic green sheet to be stripped easily. Thus, an appropriate release agent on the market can be employed and, therefore, the release agent layer can easily be designed.

The force required to strip off the supporting film when the layers were stacked in the case where an appropriate release agent layer was employed was measured. Results are shown in Table 1.

TABLE 1

|  | Force required to strip a supporting film |
|---|---|
| Conventional Structure | 20 g/cm$^2$ |
| Embodiments 4 and 5 | 3 g/cm$^2$ |

As can be understood from Table 1, the supporting film could be stripped from the ceramic green sheets according to the fourth and fifth embodiments with a force that was one-third that required with the conventional structure. Therefore, a problem of defective transference can satisfactorily be prevented and, thus, generation of delamination can significantly be prevented.

The following embodiments are additional examples, in each of which the present invention is adapted to manufacture a monolithic capacitor. The following processes, including the process for obtaining the monolithic ceramic structure which has not been fired, employ a mother multilayered metal film and a mother ceramic green sheet.

Sixth Embodiment

Figure 13A:
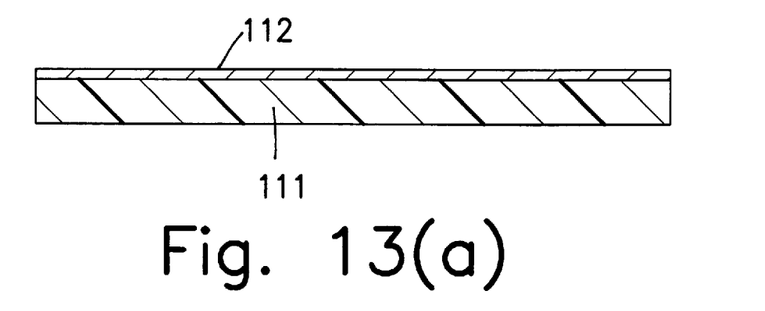
FIGS. 13A and 13B are cross sectional views respectively showing a step of forming a first metal film and a step of forming second metal films in pattern holes in a resist.
Figure 13B:
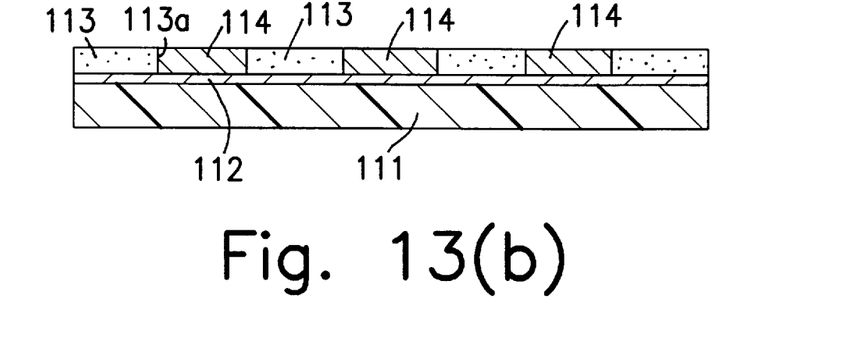

As shown in FIG. 13(a), a polyethylene terephthalate (PET) film was prepared serving as the first supporting member 111. The top surface of the first supporting member 111 was coated with silicon resin (not shown). A first metal film 112 was formed thereon. The first metal film 112 could be obtained by forming an Ag film having a thickness of 70 nm on the entire surface of the first supporting member 111 by an evaporation method. Then, a resist layer having a thickness of 1 $\mu$m is applied to the top surface of the first metal film 112, and then exposing and developing processes are performed. As a result, a resist layer 113 patterned as shown in FIG. 13(b) is formed. Next, a second metal film 114 is formed in each of the pattern holes 113a of the resist layer 113 by a thin film forming method. In this embodiment, the second metal film 114 is formed to have a thickness of 0.5 $\mu$m by electroplating Pd.

Figure 14:
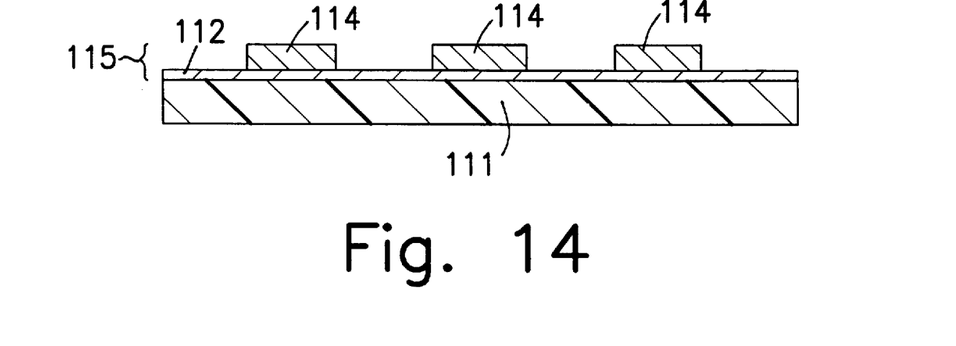
FIG. 14 is a cross sectional view showing a step of forming a multilayered metal film on a supporting member.

Then, the resist layer 113 is stripped off by using resist stripping liquid or the like. Thus, a multilayered metal film 115 shown in FIG. 14 is obtained, the multilayered metal film 115 including the second metal film 114 formed on part of the first metal film 112. The multilayered metal film 115 is in contact with the first supporting member 111 on only the lower surface of the first metal film 112. As a result, the releasing layer on the PET film is only required with respect to releasing the first metal film 112. Therefore, the releasing layer on the top surface of the PET film can easily be designed.

The second metal film 114 corresponds to the portion to be finally used as the internal electrode, while the first metal film 112 is to be changed into an insulating structure due to a process to be described later.

Next, a ceramic green sheet 116 is formed on the multilayered metal film 115. In this embodiment, ceramic slurry is formed into a sheet having a thickness of 8 $\mu$m by a microgravure method so that a ceramic green sheet 116 is formed (see FIG. 15).

Figure 15:
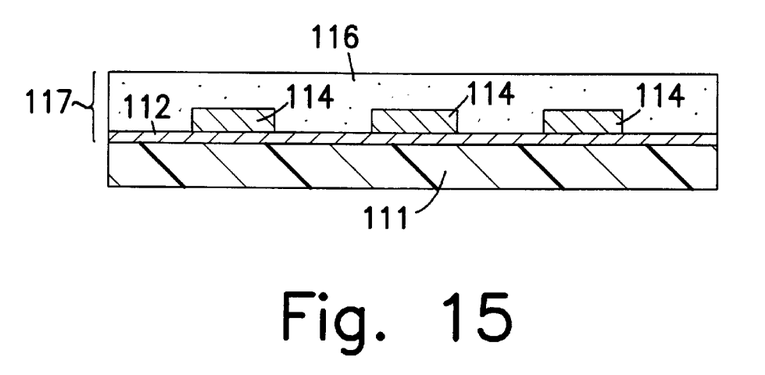
FIG. 15 is a cross sectional view showing a step of forming a green sheet integrally having the metal film by molding a ceramic green sheet on the multilayered metal film.

As shown in FIG. 15, by forming the ceramic green sheet 116, a green sheet 117 having the above-mentioned metal films is prepared while being supported on the PET film 111.

Figure 16:
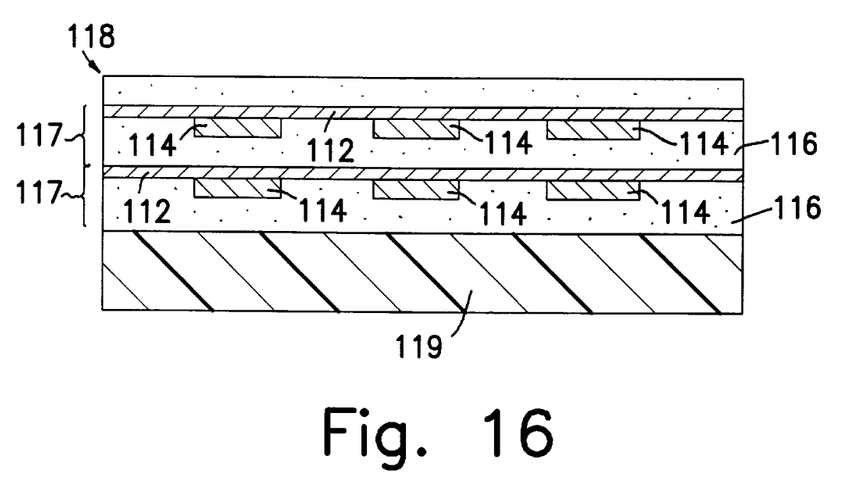
FIG. 16 is a cross sectional view showing a monolithic ceramic structure.

Then, the green sheets 117 are sequentially stacked so that a mother laminated structure 118 shown in FIG. 16 is obtained. Although FIG. 16 shows two of the green sheets 117 in the laminated structure 118, additional such green sheets 117 may be further stacked in the upward direction. Reference numeral 119 represents a supporting film for use in the laminating process.

The mother laminated structure 118 is cut in a direction of its thickness to be formed into individual monolithic ceramic structures for respective monolithic capacitors. Thus, monolithic ceramic structures for respective monolithic capacitors are obtained.

Figure 17:
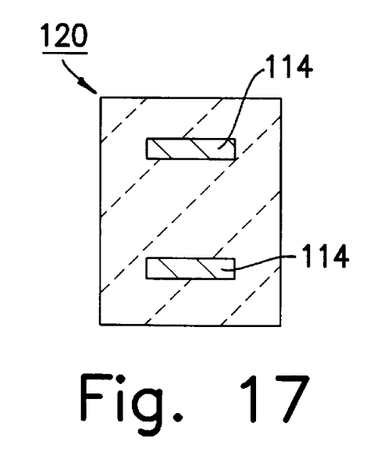
FIG. 17 is a cross sectional view showing a sintered structure.

The monolithic ceramic structures are fired at 1200° C. for 4 hours in the atmosphere. In the firing process, the first metal film 112 is converted into an insulating structure at the same time as the non-fired ceramics are fired. That is, metal components forming the first metal film 112 are changed into oxide ions which are diffused into the surrounding ceramics so as to be changed into insulating substances. Therefore, only the internal electrodes formed by the second metal films 114 remain in a final sintered structure 120, the cross sectional shape of which is shown in FIG. 17. Although FIG. 17 shows only two second metal films 114, a multiplicity of additional second metal films 114 serving as the internal electrodes overlap one another in the upward direction with ceramic layers being interposed between them.

Figure 18:
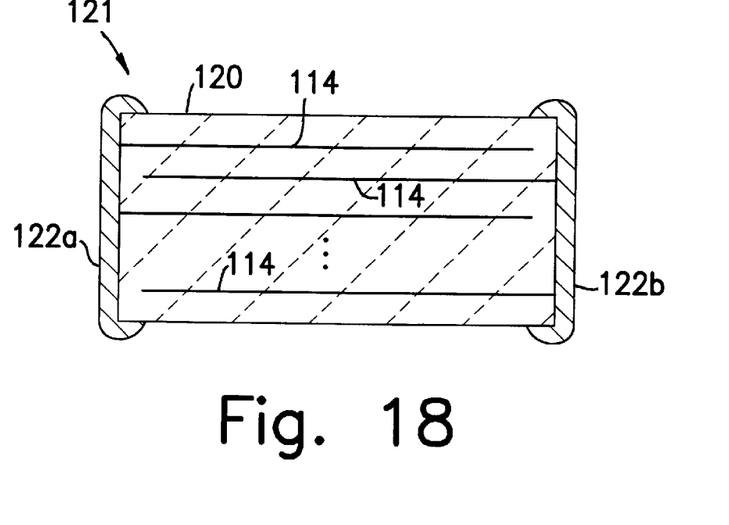
FIG. 18 is a cross sectional view showing a monolithic capacitor.

By forming a pair of external electrodes on the two end surfaces of the sintered structure 120, a monolithic capacitor 121 shown in FIG. 18 is obtained. In the monolithic capacitor 121, a plurality of the internal electrodes formed by the second metal films 114 overlap one another in the sintered structure 120. Sintered ceramic material intervenes between the internal electrodes. Note that reference numerals 122a and 122b represent external electrodes. The external electrodes 122a and 122b can be formed by any appropriate method, such as applying, firing or plating of conductive paste.

The generation of a stepped portion in the thus-obtained monolithic capacitor, between a portion in which the internal electrodes overlapped one another, and a portion in which the internal electrodes did not overlap, was examined. It was found that the stepped portion can be reduced by a quantity obtainable by calculating (the thickness of the first metal film)×(the number of stacked first metal films).

Twenty monolithic capacitors were prepared, and each of the monolithic capacitors was cut in such a manner that its cross-section is exposed to the outside as shown in FIG. 18 to observe whether or not delamination has taken place. No delamination was observed. Similarly, twenty monolithic capacitors were cut in such a manner that their cross-sections perpendicular to the cross-section shown in FIG. 18 were exposed to the outside. Again, no delamination was observed.

By comparison, it was observed that delamination had taken place in five monolithic capacitors out of every twenty monolithic capacitors obtained by the first method described above as related background art. The cross-sections observed were in the same directions as the cross-sections shown in FIG. 18.

Since the fusing point of the first metal film was about 960° C., which was a sufficiently low level with respect to the sintering temperature of 1200° C., the first metal film was formed into the insulating structure. Therefore, the monolithic capacitors according to the embodiment were free from short circuits.

Seventh Embodiment

Similarly to the sixth embodiment, monolithic capacitors were manufactured, except that the first metal film was made of Cu and the second metal film was made of Ni. The ceramic slurry was composed of $BaTiO_3$-type ceramics which did not contain Cu. The firing process was performed with the partial pressure of oxygen set to a level at which the plated Ni film could not be oxidized, but at which the evaporated Cu film could be oxidized, during the initial period of the firing process, that is, half of the period during which the temperature for firing was maintained at the highest level. Specifically, the partial pressure of oxygen was set to $10^{-4}$ Pa. After the initial period of the firing process had been performed at the partial pressure of oxygen of $10^{-4}$ Pa, the firing process was performed in a reducing atmosphere. The other conditions were the same as those employed in the sixth embodiment so that the monolithic capacitors were manufactured.

The sintered structure of each of the monolithic capacitors obtained in the seventh embodiment was analyzed. Uniform distribution of Cu in the ceramics was confirmed. That is, diffusion of Cu composing the first metal film in the ceramics was confirmed.

The electrical characteristics of the obtained monolithic capacitors were measured. As a result, an effect similar to that obtainable in the case where Cu powder was added to $BaTiO_3$-type ceramics could be obtained.

The cross-section of each monolithic capacitor was observed similarly to the sixth embodiment. No generation of delamination was observed.

Although in the seventh embodiment, the partial pressure of oxygen was controlled in the initial period of the firing process to diffuse Cu composing the first metal film, an oxidation diffusing agent may be added to the first metal film or a diffusion enhancer may be added to diffuse the metal components composing the first metal film into the ceramics.

Eighth Embodiment

Figure 19:
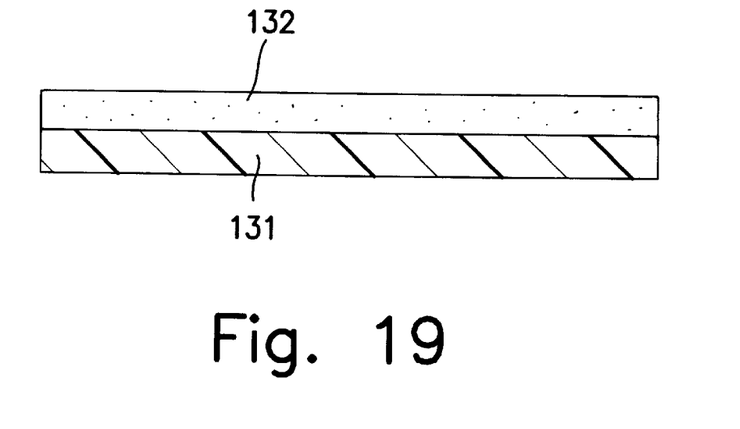
FIG. 19 is a cross sectional view showing a step of forming a ceramic green sheet on a second supporting member according to an eighth embodiment of the invention.

As shown in FIG. 19, a PET film serving as the second supporting member 131 is prepared. The top surface of the PET film 131 is coated with silicon resin (not shown).

By forming ceramic slurry on the PET film 131 by a doctor blade method and then drying it, a ceramic green sheet 132 having a thickness of 8 $\mu$m is formed.

Figure 20:
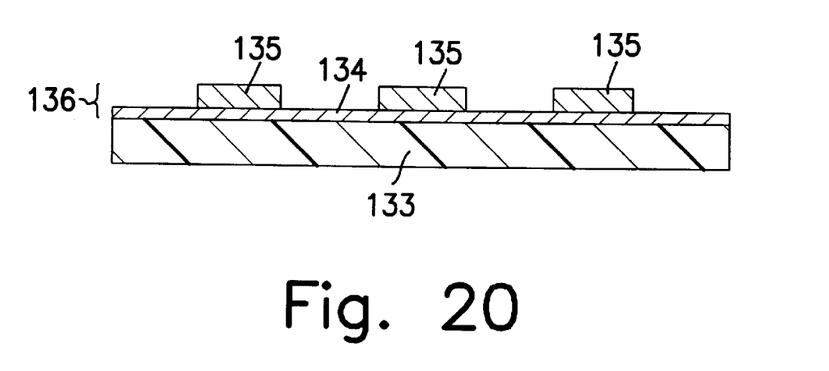
FIG. 20 is a cross sectional view showing a step of forming a multilayered metal film.

On the other hand, a PET film shown in FIG. 20 is prepared as the first supporting member 133. The top surface of the PET film 133 is coated with silicon resin (not shown).

Similarly to the sixth embodiment, a first metal film 134 and a second metal film 135 are formed on the PET film 133. In this embodiment, the first metal film 134 is made of Ag and the second metal film 135 is made of Pd. Thus, a multilayered metal film 136 is formed.

Figure 21:
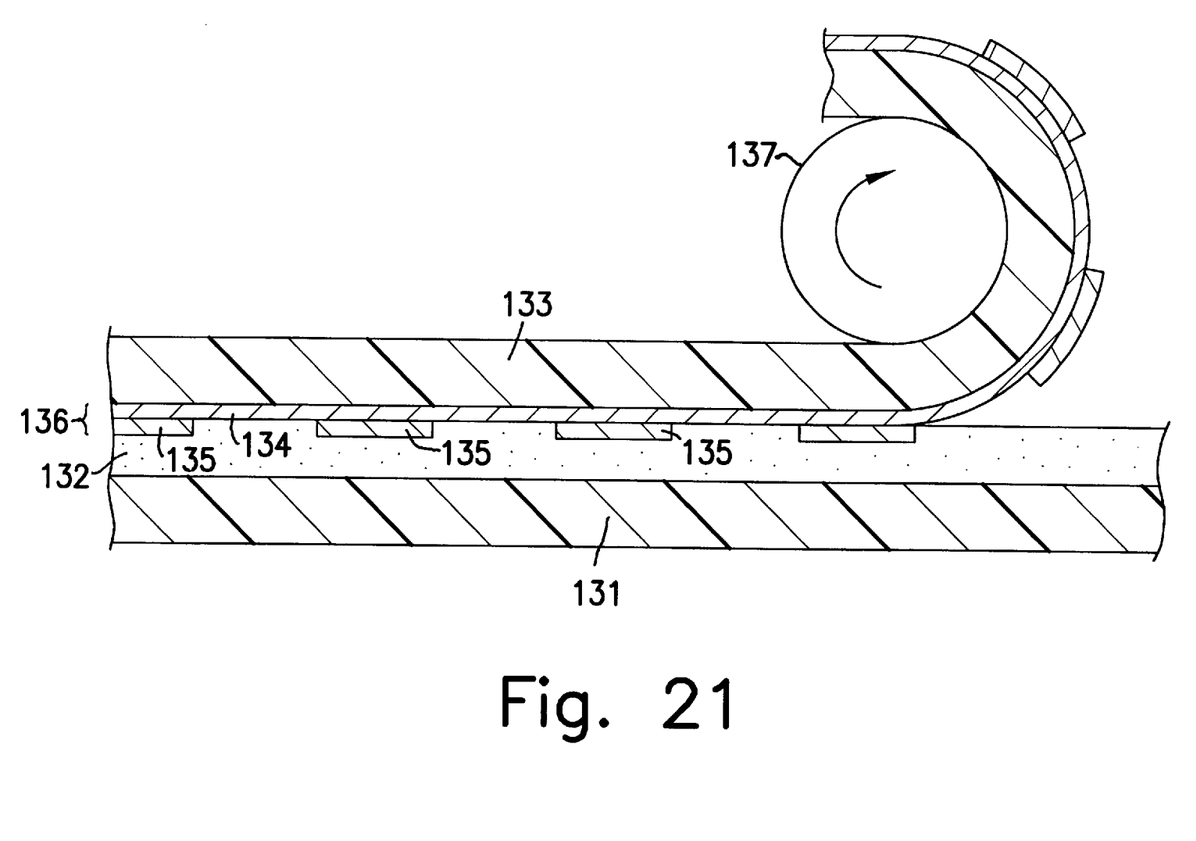
FIG. 21 is a cross sectional view showing a process for transferring a multilayered metal film to a ceramic green sheet by the method according to the eighth embodiment.
Figure 22:
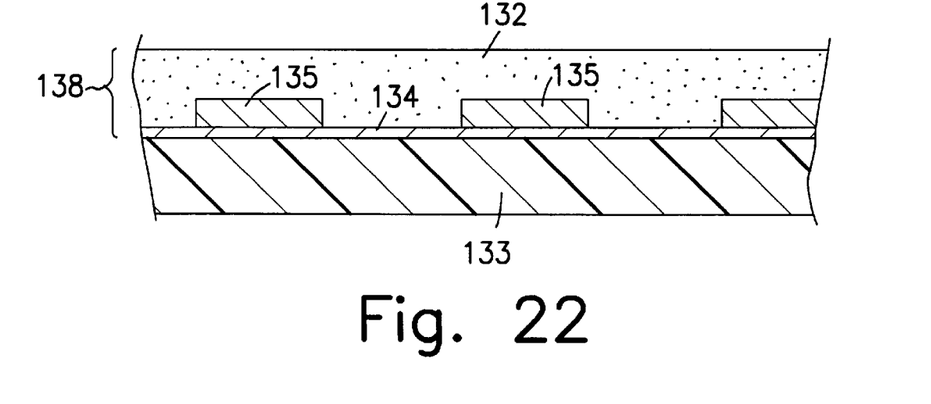
FIG. 22 is a cross sectional view showing a green sheet integrally having the metal film obtained according to the eighth embodiment.

Then, a calender roll 137 is used as shown in FIG. 21 to transfer the multilayered metal film 136 to the ceramic green sheet 132. Then, the PET film 131 is stripped off so that a green sheet 138 integrally having the metal film 136 as shown in FIG. 22 is obtained.

By stacking the thus-obtained green sheets 138, a laminated structure can be obtained. That is, by stripping and stacking the PET films 133 while transferring the green sheets 138, a monolithic ceramic structure similar to that obtained in the sixth embodiment can be obtained.

The thus-obtained monolithic ceramic structures were used to manufacture monolithic capacitors similarly to the sixth embodiment.

An observation was performed as to whether or not the obtained monolithic capacitors according to the eighth embodiment encountered delamination. No generation of delamination was observed.

Since the method of manufacturing a monolithic capacitor employing the conventional transferring method involves the ceramics and the metal film being in contact with the supporting film, the supporting film must be easily stripped from both of the ceramics and the metal film. However, since the eighth embodiment has the structure in which only the first metal film 134 is in contact with the PET film 133, the PET film 133 is required to be easily stripped from only the first metal film 134.

In the sixth to eighth embodiments, the first metal films 112 and 134 are partially diffused in the firing process and, therefore, they are changed into insulating structures. As a result, it can be understood that a complicated process is not required in which the first metal film portion, which is not located below the second metal film, is stripped by etching or the like.

Although the sixth to eighth embodiments have the arrangement in which the first metal film is made of Ag or Cu and the second metal film is made of Pd or Ni, other metals may be employed if the effect of the present invention can be attained.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of manufacturing a monolithic ceramic electronic device, comprising the steps of:

forming a first metal film on a first supporting member by a thin film forming method;

forming, on said first metal film, a resist layer having pattern holes therein;

forming, within at least one of said pattern holes, a second metal film;

forming a monolithic ceramic structure including a plurality of said resist layers and said first and second metal films; and firing said monolithic ceramic structure so as to change said first metal films into insulating material and at least partially remove said resist layers.

2. A method of manufacturing a monolithic ceramic electronic device according to claim 1, wherein the thickness of the second metal film formed in said pattern hole is substantially larger than that of said first metal film.

3. A method of manufacturing a monolithic ceramic electronic device according to claim 1 further comprising the steps of:

forming a ceramic green sheet on a second supporting member;

separating a laminated structure including said first and second metal films and said resist layer from said first supporting member;

separating said ceramic green sheet from said second supporting member; and alternately stacking said laminated structures and said ceramic green sheets.

4. A method of manufacturing a monolithic ceramic electronic device according to claim 3, wherein said laminated structure is transferred to said ceramic green sheet by using a roll press.

5. A method of manufacturing a monolithic ceramic electronic device according to claim 1 further comprising the steps of:

forming a ceramic green sheet on a second supporting member;

transferring a laminated structure including said first and second metal films and said resist layer onto said ceramic green sheet to form a ceramic green sheet having a metal layer; and stacking a plurality of said ceramic green sheets having a metal layer to form the monolithic ceramic structure.

6. A method of manufacturing a monolithic ceramic electronic device according to claim 1, wherein said first metal film is formed to have a thickness of 0.1 μm or thinner.

7. A method of manufacturing a monolithic ceramic electronic device according to claim 1, wherein said resist layer contains a resist resin and an inorganic component.

8. A method of manufacturing a monolithic ceramic electronic device according to claim 7, wherein said inorganic component comprises ceramics.

9. A method of manufacturing a monolithic ceramic electronic device according to claim 7, wherein said inorganic component comprises glass.

10. A method of manufacturing a monolithic ceramic electronic device according to claim 7, wherein said step of firing said monolithic ceramic structure is carried out so as to remove said resist resin from said resist layer.

11. A method of manufacturing a monolithic ceramic electronic device according to claim 1, wherein said first metal film contains Cu and said second metal film contains Ni.

* * * * *